United States Patent
Chen et al.

(10) Patent No.: US 8,887,573 B2
(45) Date of Patent: Nov. 18, 2014

(54) MEMS VACUUM LEVEL MONITOR IN SEALED PACKAGE

(75) Inventors: Tung-Tsun Chen, Hsinchu (TW);
Jui-Cheng Huang, Hsinchu (TW);
Chung-Hsien Lin, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 324 days.

(21) Appl. No.: 13/401,134

(22) Filed: Feb. 21, 2012

(65) Prior Publication Data

US 2013/0213139 A1 Aug. 22, 2013

(51) Int. Cl.
*G01L 11/00* (2006.01)
*G01L 13/02* (2006.01)

(52) U.S. Cl.
USPC .............. 73/702; 73/716; 73/736; 73/718; 73/724

(58) Field of Classification Search
USPC ............................................ 73/700–756
See application file for complete search history.

(56) References Cited

U.S. PATENT DOCUMENTS

| | | | | |
|---|---|---|---|---|
| 8,256,298 B2* | 9/2012 | Suijlen et al. | | 73/702 |
| 2003/0178912 A1* | 9/2003 | Norimatsu | | 310/309 |
| 2003/0178913 A1* | 9/2003 | Norimatsu | | 310/309 |
| 2005/0274183 A1* | 12/2005 | Shcheglov et al. | | 73/504.12 |
| 2007/0034005 A1* | 2/2007 | Acar et al. | | 73/504.02 |
| 2009/0032924 A1* | 2/2009 | Stark | | 257/680 |
| 2009/0266164 A1* | 10/2009 | Furukubo et al. | | 73/514.32 |
| 2011/0012694 A1* | 1/2011 | Tamano et al. | | 333/186 |
| 2011/0107838 A1* | 5/2011 | Suijlen et al. | | 73/702 |
| 2013/0313660 A1* | 11/2013 | Nakatani et al. | | 257/415 |
| 2014/0013557 A1* | 1/2014 | Acar et al. | | 29/25.35 |
| 2014/0041174 A1* | 2/2014 | Acar et al. | | 29/25.35 |

OTHER PUBLICATIONS

Freescale Semiconductor, MPX4100A, Rev. 9, Jan. 2009.

* cited by examiner

*Primary Examiner* — Andre Allen
(74) *Attorney, Agent, or Firm* — Duane Morris LLP

(57) ABSTRACT

A vacuum sensor for sensing vacuum in a sealed enclosure is provided. The sealed enclosure includes active MEMS devices desired to be maintained in vacuum conditions. The vacuum sensor includes a motion beam anchored to an internal surface in the sealed enclosure. A driving electrode is disposed beneath the motion beam and a bias is supplied to cause the motion beam to deflect through electromotive force. A sensing electrode is also provided and detects capacitance between the sensing electrode disposed on the internal surface, and the motion beam. Capacitance changes as the gap between the motion beam and the sensing electrode changes. The amount of deflection is determined by the vacuum level in the sealed enclosure. The vacuum level in the sealed enclosure is thereby sensed by the sensing electrode.

20 Claims, 5 Drawing Sheets

MEMS VACUUM LEVEL MONITOR IN SEALED PACKAGE

TECHNICAL FIELD

This disclosure is directed to a system and method for monitoring vacuum level in a sealed package such as a hermetically sealed package.

BACKGROUND

It is important to be able to monitor the vacuum level in any sealed package such as a hermetically sealed package. This is especially true when MEMS (micro-electro-mechanical structures) devices are present in the sealed package. Various other micro-mechanical motion devices such as resonators, gyroscopes or other devices may also be operated in sealed packages. The MEMS or other devices may be part of an integrated circuit or other semiconductor device, and are designed to operate in a vacuum. If a desirably low vacuum level is not present, the MEMS device and thus the integrated circuit or other semiconductor device will malfunction. All seals cannot be perfect and the vacuum level or other desired internal pressure level can become degraded due to leaks. This is particularly true in semiconductor devices which are manufactured to include smaller feature sizes and smaller tolerances. It is extremely critical for MEMS devices of such semiconductor devices to operate at vacuum levels or at the pressure level desired. In semiconductor devices, the MEMS device may be formed over a substrate surface and a cover is joined to the substrate surface to form a hermetic seal resulting in an enclosure that includes the MEMS device.

It is difficult to measure the differential pressure between the outside air and the vacuum level in the package, i.e. in the enclosure. Sensors that are external to the enclosure cannot accurately measure the pressure, i.e. vacuum level, in the enclosure.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

FIG. 3A shows a motion beam disposed over driving and sensing electrodes formed over a substrate and FIG. 3B is an expanded view showing one embodiment of a coupling between the motion beam and the anchor;

DETAILED DESCRIPTION

The disclosure provides a vacuum level monitor in a sealed package. The sealed package may be airtight, i.e. a hermetically sealed package. In one embodiment, the sealed package consists of a cover joined to a semiconductor substrate surface. The sealed package may be an encapsulated package. In one embodiment, the sealed package includes, in addition to the vacuum level monitor, MEMS devices that are part of an operational circuit. The operational circuit may be an integrated circuit or another semiconductor device. The vacuum level monitor includes a motion beam. In various embodiments, the motion beam is a vertical torsional mirror, a lateral torsional mirror, a vertical fixed beam, a vertical fixed-free beam, a lateral fixed-fixed beam, or a lateral fixed-free beam with single or differential sensing and driving electrodes.

The motion beams are maintained over an internal surface and spaced, i.e. suspended, above the surface. The motion beams are coupled to the surface by an anchor. The motion beams are disposed over sensing and driving electrodes formed in or on the surface. The sensing and driving electrodes form part of the system used in monitoring the vacuum level. The vacuum level monitor includes the motion beams driven by electrostatic force applied through a driving electrode or electrodes. The electrostatic force causes the motion beam, i.e. gyroscope or other MEMS device, to deflect. The capacitance between the motion beam and the fixed sensing electrode or electrodes depends upon the spacing between the motion beam and the sensing electrode. The capacitance also depends upon the dielectric material between the motion beam and the sensing electrode, in this case air or vacuum.

When the motion beam deflects responsive to the electrostatic force, it changes position relative to the sensing electrode or electrodes also formed in or on the internal surface. The capacitance changes as the motion beam deflects and changes its position relative to the sensing electrode. The degree of bending of the motion beam depends upon the vacuum level in the enclosure, i.e. it is impacted by air damping effects. When a bias is applied and the motion beam deflects, the capacitance is measured by the sensing electrode or electrodes. When a sine wave or a square wave is applied by the driving electrode to cause the motion beam to deflect accordingly, the change in capacitance in time is sensed by the sensing electrode to provide an accurate assessment of the dielectric constant of the enclosure, i.e. of the vacuum level. Sensing circuitry coupled to the sensing electrode develops and provides a signal indicative of capacitance, change in capacitance, and therefore the vacuum level.

Figure 1:
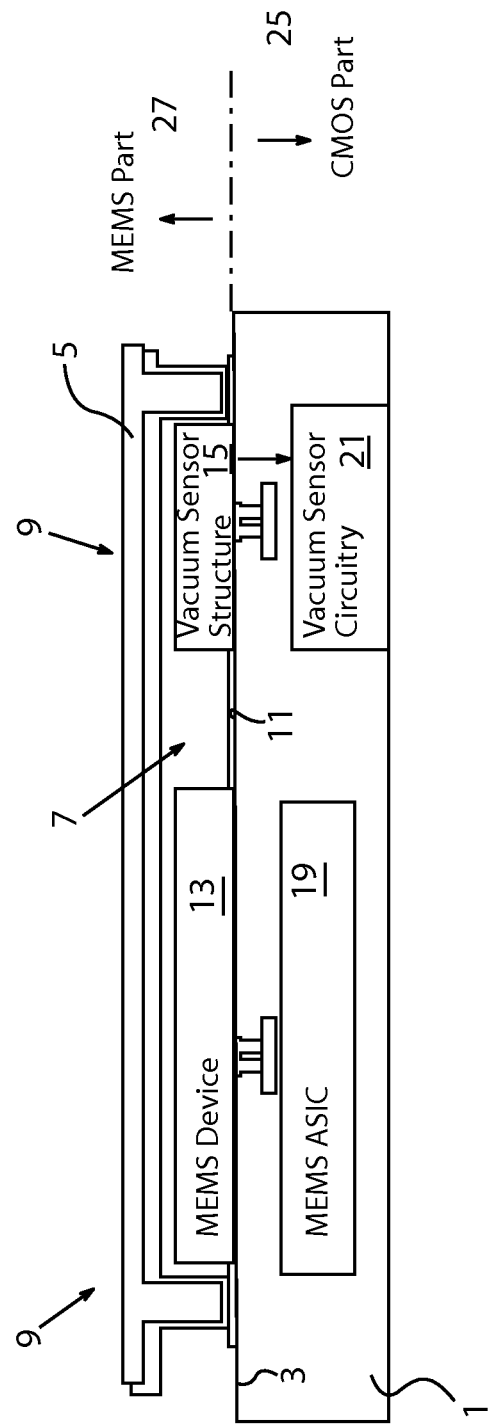
FIG. 1 is a schematic view shown in cross-section and showing components of the vacuum level monitor of the disclosure and other MEMS devices in a sealed enclosure.

Now turning to the figures, FIG. 1 is a schematic layout shown in cross-section. FIG. 1 shows substrate 1. Substrate 1 is a semiconductor substrate such as silicon or other suitable semiconductor materials in one embodiment. Substrate 1 includes top surface 3 which is formed of silicon in one embodiment. Cover 5 is disposed over and joined to top surface 3. Cover 5 may be formed of various plastics or other suitable moisture impermeable, air-tight materials. Other suitable packaging materials are used for cover 5 in other embodiments. Vacuum cavity 7 is disposed within sealed enclosure 9. In some embodiments, the enclosure is hermetically sealed. Sealed enclosure 9 is bounded by cover 5 and internal surface 11 and includes vacuum cavity 7 and internal components. Internal surface 11 is simply a portion of top surface 3 that is covered by cover 5 in the illustrated embodiment. MEMS device 13 is within sealed enclosure 9. MEMS device 13 includes one or more MEMS devices that are operational MEMS devices and form part of an active operational device. In one embodiment, the MEMS device 13 represents one or more MEMS devices coupled to a MEMS application specific integrated circuit ("ASIC") 19 disposed within substrate 1. In other embodiments, the MEMS device 13 formed within enclosure 9 is coupled to and forms part of various other circuits.

Sealed enclosure 9 is essentially formed by cover 5 where it is joined to substrate 1. Vacuum sensor structure 15 lies within vacuum cavity 7 of sealed enclosure 9. Vacuum sensor structure 15 is shown schematically in FIG. 1 and will be shown in more detail in the following figures. Vacuum sensor structure 15 is coupled to vacuum sensor circuitry 21 which is illustrated within substrate 1 in the illustrated embodiment but can be in or on top surface 3. The horizontal dashed line representing the continuation of top surface 3 essentially acts as a dividing line between the CMOS part 25 of the structure of the illustrated embodiment and the MEMS part 27 of the structure of the illustrated embodiment.

Figure 2:
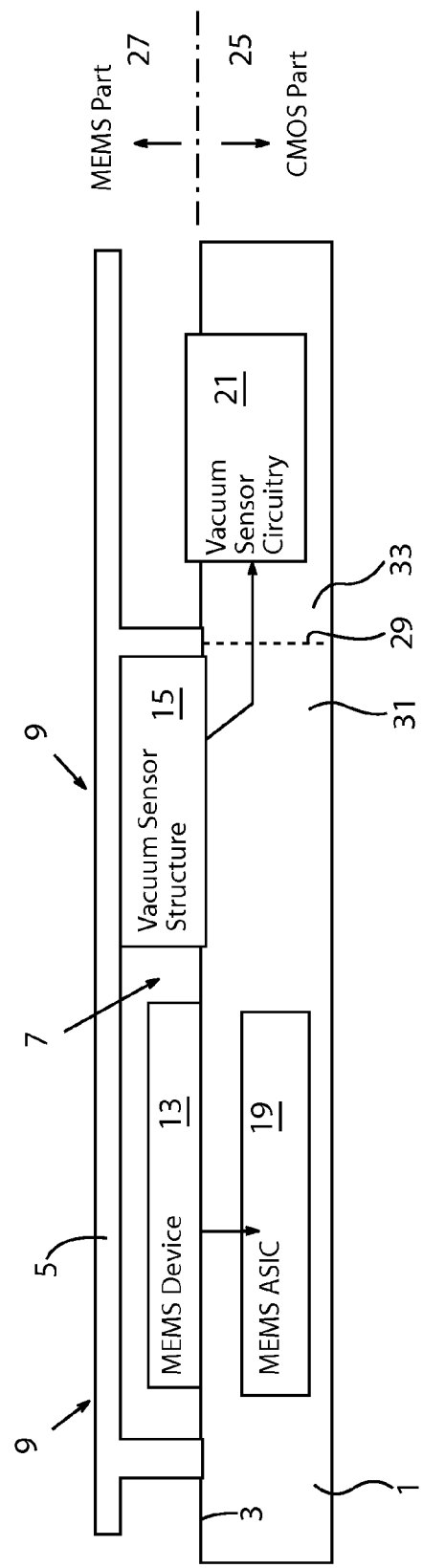
FIG. 2 is another schematic view shown in cross-section showing an embodiment of the vacuum level monitor of the disclosure within a sealed enclosure that also includes operational MEMS devices.

FIG. 2 shows the structures as shown in FIG. 1 but in FIG. 2, dashed line 29 indicates the distinction between chip 31 and scribe line 33. In the embodiment shown in FIG. 2, the vacuum sensor circuitry 21 is in scribe line 33. In this manner, the vacuum sensor circuitry 21 does not take up valuable real estate within chip 31 enabling greater levels of integration within chip 31.

Figure 3:
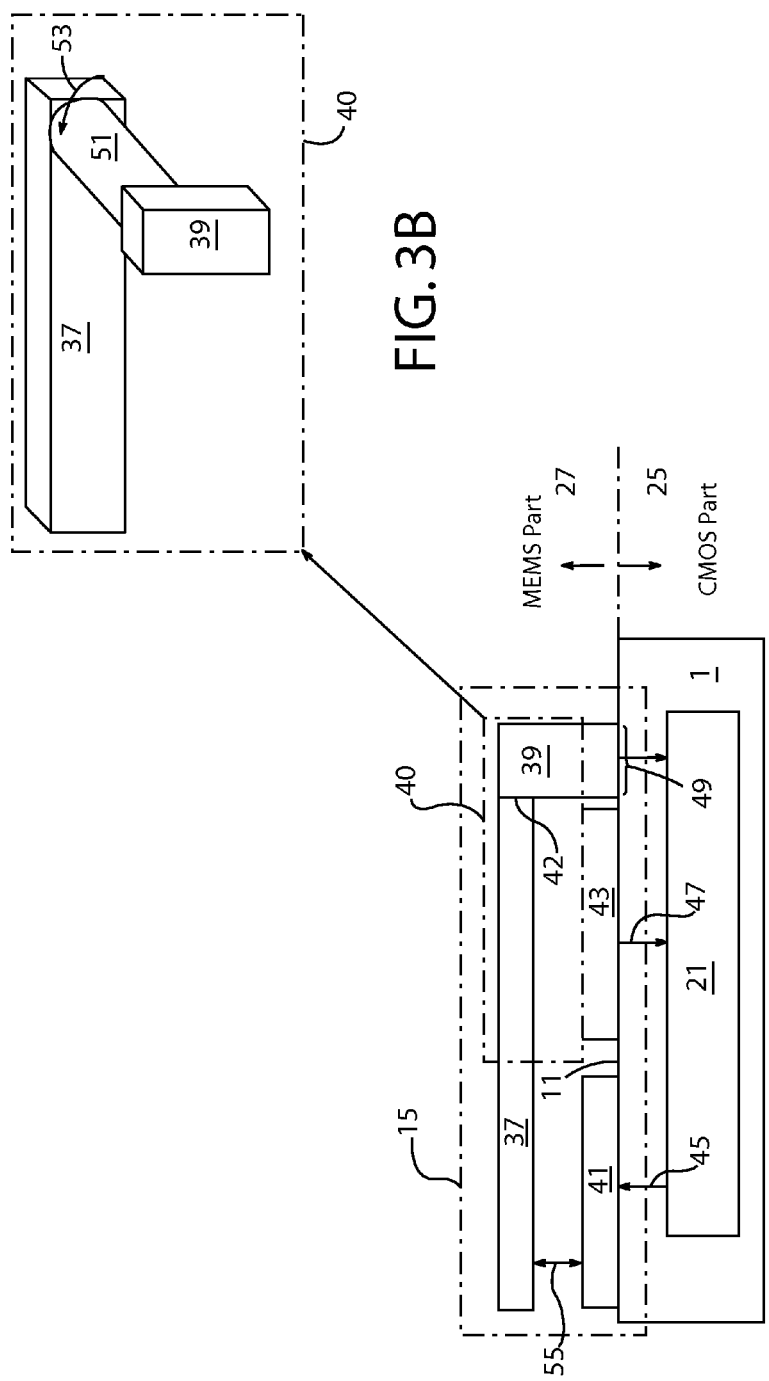
FIGS. 3A and 3B are cross-sectional views showing additional details of an embodiment of a vacuum level monitor according to the disclosure.

FIGS. 3A and 3B show further details of the vacuum sensor structure 15 that was shown in FIG. 2. Vacuum sensor structure 15 is indicated by the dashed lines in FIG. 3A and it should be understood that vacuum sensor structure 15 is enclosed within a sealed enclosure such as sealed enclosure 9 shown in FIG. 2. However, cover 5 is omitted from FIGS. 3A and 3B to more clearly illustrate other features. The vacuum sensor structure includes motion beam 37 attached to internal surface 11 by anchor 39. Motion beam 37 and anchor 39 are formed using known MEMS manufacturing techniques. Motion beam 37 may be formed of silicon including single crystal silicon, polycrystalline silicon, or other suitable silicon morphologies in various embodiments. Anchor 39 is coupled to internal surface 11 at anchor location 49. Anchor 39 is formed of silicon or other suitable materials. Portions of internal surface 11 that are disposed beneath motion beam 37 are considered the electrode portion and include driving electrode 41 and sensing electrode 43. Driving electrode 41 and sensing electrode 43 may be formed in or on internal surface 11 in various embodiments. Each of driving electrode 41 and sensing electrode 43 are formed of suitable conductive materials such as metals. In one embodiment aluminum or copper is used as the metal. In one embodiment, silicon or other semiconductor materials are used for driving electrode 41 and/or sensing electrode 43. In one embodiment, driving electrode 41 and sensing electrode 43 are essentially coplanar with internal surface 11. In one embodiment, "driving electrode 41" represents a plurality of differential driving electrodes and in one embodiment, "sensing electrode 43" represents a plurality of differential sensing electrodes.

Motion beam 37 and anchor 39 form a MEMS device. In one embodiment, end 42 of motion beam 37 is coupled directly to anchor 39 and motion beam 37 is capable of upward and downward deflection. More particularly, motion beam 37 may be capable of upward and downward resonant motion. Another embodiment is shown in the side view indicated by dashed line 40 in FIG. 3A. This embodiment includes a different torsional connection when shown in three dimension. According to the embodiment shown in FIG. 3B, motion beam 37 is coupled to anchor 39 by means of torsion arm 51 and arrow 53 indicates that motion beam 37 is capable of torsional motion in response to an electromotive force or other force as will be shown in FIG. 3A. The arrangement shown in FIG. 3B is a gyroscope and in FIG. 3B, motion beam 37 is disposed over a corresponding driving electrode and sensing electrode.

Now returning to FIG. 3A, FIG. 3A shows vacuum sensing circuitry 21 coupled to driving electrode 41 as indicated by arrow 45. Vacuum sensing circuitry 21 is coupled to sensing electrode 43 as indicated by arrow 47. Gap 55 between motion beam 37 and driving electrode 41 in resting position may range between 1-10 microns in various embodiments, but other gap spacings are used in other exemplary embodiments.

The aforementioned components of the vacuum sensor structure 15 are made using the same sequence of processing operations used to fabricate the active features of the integrated circuit or other semiconductor device formed on the substrate.

Figure 4:
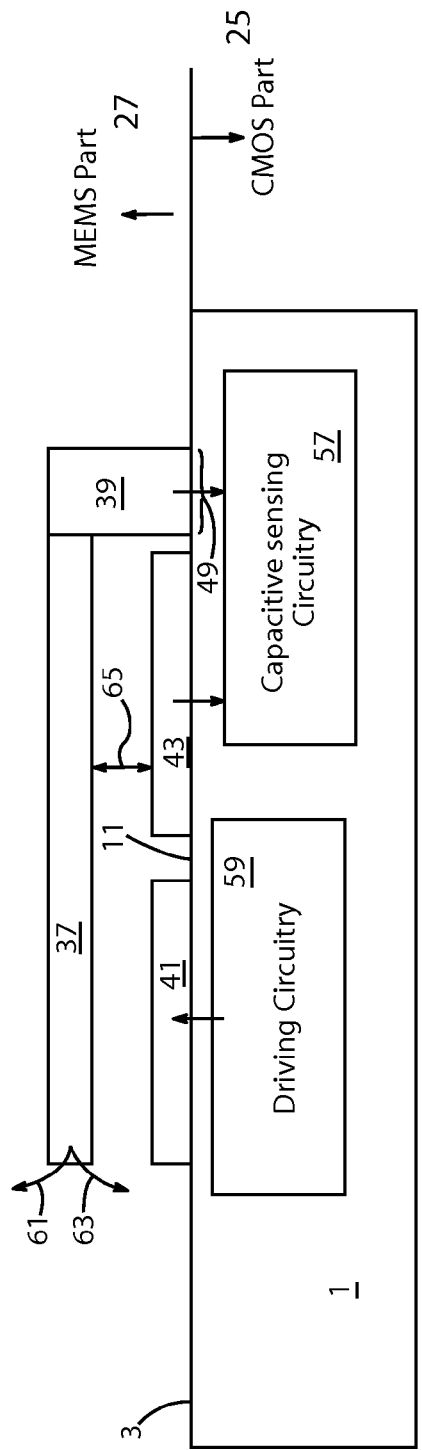
FIG. 4 is a cross-sectional view showing details of an embodiment of a vacuum level monitor according to the disclosure.

FIG. 4 shows the vacuum sensor structure in more detail although cover 5 is again not shown in order to more clearly present other features. It should be understood that the vacuum sensing features shown in FIG. 4 are disposed in a sealed enclosure. In FIG. 4, driving circuitry 59 drives driving electrode 41. In some embodiments, driving circuitry 59 produces a square wave or sinusoidal wave or various other waves. In some embodiments, driving circuitry 59 produces a constant driving bias. Driving circuitry 59 provides a bias, i.e. a voltage, to driving electrode 41. The frequency of the applied bias is about 1-10 kilohertz in one embodiment but other suitable frequencies may be used in other embodiments. Driving circuitry 59 may be a resonator, i.e. an electrical circuit that combines capacitance and inductance in such a way that a periodic electric oscillation is produced with maximum amplitude. The bias level and frequency may depend, at least in part, upon the spring constant of motion beam 37 which can vary based on material and dimension.

When driving circuitry 59 provides a bias, i.e. an electromotive force to driving electrode 41, this causes motion beam 37 to deflect. Motion beam 37 may deflect upwardly, as indicated by arrow 61, or it may deflect downwardly, as indicated by arrow 63 or it may resonate and deflect alternately upwardly (arrow 61) and downwardly (arrow 63). For a given applied bias and a given spring constant of motion beam 37, the degree of deflection of motion beam 37 will be determined at least in part by the pressure within vacuum cavity 7. If vacuum cavity 7 is truly in a vacuum state, motion beam 37 will deflect maximally. If a pressure higher than a vacuum condition is present within sealed enclosure 9, motion beam 37 will deflect to a lesser degree due to an air damping effect. Gap 65 between motion beam 37 and sensing electrode 43 determines the capacitance between motion beam 37 and sensing electrode 43. The capacitance changes as the distance between motion beam 37 and sensing electrode 43 changes. In other words, the capacitance changes as the distance of gap 65 changes. Capacitance as a function of time is sensed by capacitive sensing circuitry 57. As shown in FIG. 2, for example, capacitive sensing circuitry 57 and driving circuitry 59 may be substantially contained within scribe lines of a semiconductor device. In some embodiments, motion beam 37 essentially deflects upwardly and downwardly and in other embodiments motion beam 37 is torsionally coupled to anchor 39 and moves as does a gyroscope. Capacitive sensing circuitry 57 measures capacitance when motion beam is in its rest position and also when it is at maximal deflection. Capactive sensing circuitry develops and delivers a signal indicative of capacitance and therefore vacuum level in the sealed enclosure.

Figure 5:
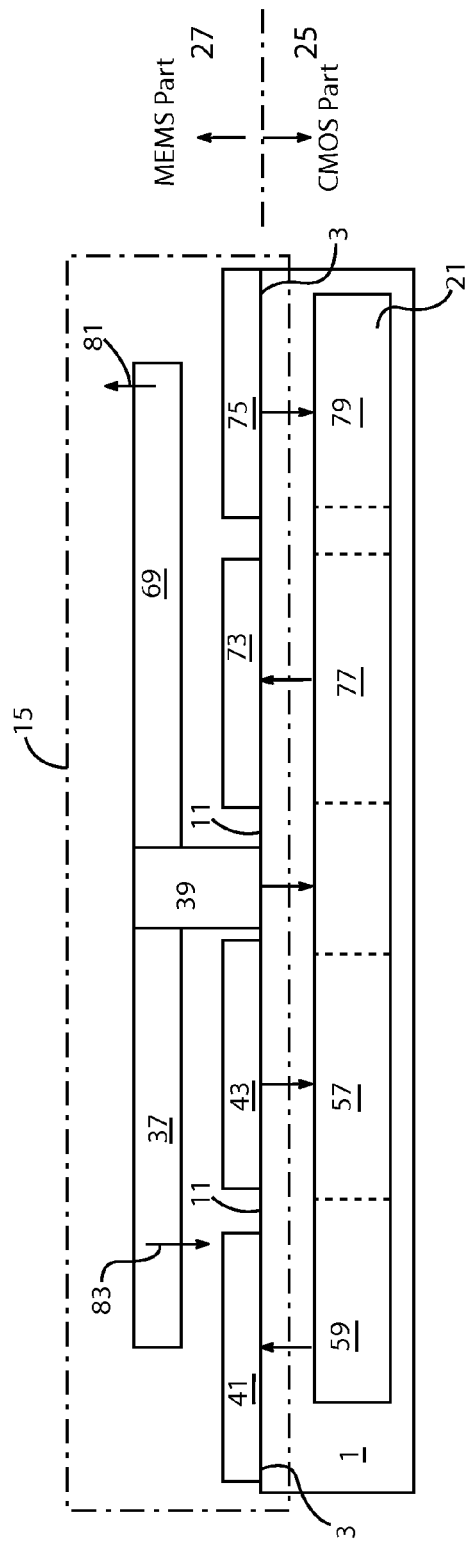
FIG. 5 is a cross-sectional view showing another embodiment of a vacuum level monitor according to the disclosure.

FIG. 5 shows another embodiment of a vacuum sensor according to the disclosure. Another embodiment of vacuum sensor structure 15 is indicated by the dashed line. It should be understood that the vacuum sensor structure is disposed within a sealed enclosure such as sealed enclosure 9 shown in FIG. 2. It should also be understood that operational MEMS devices are also disposed within the sealed enclosure 9 along with vacuum sensor structure 15, although not shown.

FIG. 5 shows motion beam 37 and further motion beam 69 extending in diametrically opposite directions from anchor 39. Further motion beam 69 is formed of silicon and is directly coupled to anchor 39 in one embodiment. In another embodiment, further motion beam 69 is coupled to anchor 39 through a torsion arm such as shown in FIG. 3B. In one embodiment, further motion beam 69 is formed of single crystal silicon and in another embodiment further motion beam 69 is formed of polycrystalline silicon. In one embodiment, both motion beam 37 and further motion beam 69 are formed of the same material. In one embodiment, both motion beam 37 and further motion beam 69 are formed of suitable non-silicon semiconductor materials. Motion beam 37, driving electrode 41, sensing electrode 43, driving circuitry 59 and capacitive sensing circuitry 57 have been described previously. Driving electrode 75 and sensing electrode 73 are also formed on internal surface 11 in the electrode region beneath further motion beam 69. Driving electrode 75 and sensing electrode 73 are formed of suitable conductive materials. Aluminum, copper, silicon and other suitable metal and semiconductor materials are used for sensing electrode 73 and driving electrode 75 in various embodiments. Driving electrode 75 is coupled to driving circuitry 79 and sensing electrode 73 is coupled to capacitive sensing circuitry 77.

Still referring to FIG. 5, in one embodiment, equal and opposite biases are applied to driving electrodes 41 and 75 causing the torsional bending of the motion beam 37/anchor 39/further motion beam 69 structure. In one embodiment, further motion beam 69 moves in an upward direction as indicated by arrow 81 while motion beam 37 moves downwardly (arrow 83) at the same time. This embodiment provides additional motion and perhaps exaggerated bending enabling a more significant difference in capacitance in time to be realized and measured.

Embodiments of the disclosure provide the advantage that the vacuum level monitor can be used to monitor vacuum level in any package type such as 3D stacked chips. The process for forming the vacuum sensor structure including the driving and sensing circuitry, e.g. the resonator circuitry and the gyroscope, uses the same processing operations used to simultaneously form the active devices being formed. When the voltage is applied by the driving circuitry, an electrostatic force either pulls the motion beam toward the driving electrode or urges the motion beam away from the driving electrode.

In one embodiment, an apparatus for measuring vacuum level in a sealed enclosure is provided. The apparatus comprises: a sealed enclosure with an internal surface; a motion beam anchored to the internal surface at an anchor location and disposed over an electrode portion of the internal surface; a driving electrode disposed in the internal surface in the electrode portion; and a sensing electrode disposed in the internal surface in the electrode portion.

A method for measuring vacuum level in a sealed enclosure is also provided. The method comprises: providing a sealed enclosure with an internal surface and a motion beam coupled to the internal surface via an anchor disposed at an anchor location, the motion beam disposed over an electrode portion of the internal surface with a gap present between the motion beam and the internal surface; biasing a driving electrode disposed in or on the internal surface in the electrode portion; and measuring capacitance between the motion beam and a sensing electrode disposed in or on the internal surface in the electrode portion.

Another embodiment of a method for measuring vacuum level in a sealed enclosure is also provided. The method comprises: providing a sealed enclosure with an internal surface and a motion beam anchored to the internal surface at an anchor location and suspended over an electrode portion of the internal surface; causing the motion beam to deflect upward or downward; and measuring capacitance between the motion beam and a sensing electrode disposed in the internal surface in the electrode portion when the motion beam is deflected.

The preceding merely illustrates the principles of the disclosure. It will thus be appreciated that those of ordinary skill in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those of ordinary skill in the art without departing from the scope and range of equivalents of the disclosure.

What is claimed is:

1. An apparatus for measuring vacuum level in a sealed enclosure, said apparatus comprising:
    a sealed enclosure with an internal surface;

a motion beam anchored to said internal surface at an anchor location and disposed over an electrode portion of said internal surface;

a driving electrode disposed in said internal surface in said electrode portion; and a sensing electrode disposed in said internal surface in said electrode portion.

2. The apparatus as in claim 1, wherein said sealed enclosure includes a hermetic seal, said enclosure includes an interior portion essentially under vacuum conditions, and a gap is present between said motion beam and said internal surface.

3. The apparatus as in claim 1, wherein said sealed enclosure further includes an operational MEMS (micro-electromechanical structure) device therein, said operational MEMS device being part of an integrated circuit.

4. The apparatus as in claim 1, wherein said internal surface comprises a portion of a surface of a semiconductor substrate that includes semiconductor devices formed thereon, said sealed enclosure includes a cover coupled to said surface, and a gap is present between said motion beam and said internal surface.

5. The apparatus as in claim 4, wherein said sensing electrode is coupled to sensing circuitry formed in or on said substrate, said sensing circuitry sensing capacitance and providing a signal representative of capacitance between said motion beam and said sensing electrode.

6. The apparatus as in claim 4, wherein said driving electrode is coupled to driving circuitry disposed in or on said substrate and biases said driving electrode.

7. The apparatus as in claim 4, further comprising circuitry disposed in a scribe line of said semiconductor substrate, said circuitry being at least one of driving circuitry disposed in or on said substrate and coupled to said driving electrode, and capacitance sensing circuitry disposed in or on said substrate and coupled to said sensing electrode.

8. The apparatus as in claim 1, wherein said motion beam is formed of silicon and said driving electrode is coupled to driving circuitry that comprises a resonator.

9. The apparatus as in claim 1, wherein said motion beam comprises a gyroscope, said motion beam having a length and laterally coupled to said anchor via a torsion arm.

10. The apparatus as in claim 1, further comprising a second motion beam within said sealed enclosure.

11. The apparatus as in claim 10, wherein said further motion beam is coupled to said anchor, said motion beam and said further motion beam arranged linearly and extending diametrically from said anchor, and further comprising a further driving electrode and a further sensing electrode in cooperation with said further motion beam and each disposed in or on said internal surface beneath said further motion beam.

12. The apparatus as in claim 1, wherein said sensing electrode is disposed between said driving electrode and said anchor location.

13. A method for measuring vacuum level in a sealed enclosure, said method comprising:

providing a sealed enclosure with an internal surface and a motion beam coupled to said internal surface via an anchor disposed at an anchor location, said motion beam disposed over an electrode portion of said internal surface, with a gap present between said motion beam and said internal surface;

biasing a driving electrode disposed in or on said internal surface in said electrode portion; and measuring capacitance between said motion beam and a sensing electrode disposed in or on said internal surface in said electrode portion.

14. The method as in claim 13, wherein said sensing electrode is disposed between said driving electrode and said anchor and said sealed enclosure further includes therein a MEMS (micro-electro-mechanical structure) device coupled to an integrated circuit.

15. The method as in claim 13, wherein said motion beam comprises a gyroscope and is coupled to said anchor by a torsion arm.

16. The method as in claim 13, further comprising providing a resonator circuit coupled to said driving electrode and wherein said biasing comprises providing said bias in the form of a square wave or a sinusoidal wave and at a frequency of about 1-10 KHz.

17. The method as in claim 13, wherein said internal surface comprises a portion of a surface of a semiconductor substrate with semiconductor devices formed thereon; and further comprising providing a MEMS (micro-electro-mechanical structure) device in said sealed enclosure, said MEMS device forming part of said semiconductor devices; and operating at least one of said semiconductor devices.

18. The method as in claim 13, wherein said biasing causes said motion beam to deflect and said measuring capacitance includes measuring capacitance when said motion beam is deflected.

19. A method for measuring vacuum level in a sealed enclosure, said method comprising:

providing a sealed enclosure with an internal surface and a motion beam anchored to said internal surface at an anchor location and suspended over an electrode portion of said internal surface;

causing said motion beam to deflect upward or downward; and measuring capacitance between said motion beam and a sensing electrode disposed in or on said internal surface in said electrode portion when said motion beam is deflected, wherein said causing comprises providing a bias to a driving electrode disposed beneath said motion beam, thereby causing said motion beam to deflect due to electromotive force.

20. The method as in claim 19, further comprising said sealed enclosure including MEMS (micro-electro-mechanical structure) devices therein, said MEMS devices coupled to an integrated circuit.

* * * * *